(12) United States Patent
Uzoh

(10) Patent No.: US 9,433,093 B2
(45) Date of Patent: Aug. 30, 2016

(54) HIGH STRENGTH THROUGH-SUBSTRATE VIAS

(71) Applicant: INVENSAS CORPORATION, San Jose, CA (US)

(72) Inventor: Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/337,196

(22) Filed: Jul. 21, 2014

(65) Prior Publication Data

US 2015/0146393 A1      May 28, 2015

Related U.S. Application Data

(63) Continuation of application No. 13/293,698, filed on Nov. 10, 2011, now Pat. No. 8,785,790.

(51) Int. Cl.
| | |
|---|---|
| *H05K 1/11* | (2006.01) |
| *H05K 3/42* | (2006.01) |
| *H01L 23/498* | (2006.01) |
| *H05K 1/03* | (2006.01) |
| *H05K 1/09* | (2006.01) |
| *H01L 23/14* | (2006.01) |

(52) U.S. Cl.
CPC ......... *H05K 1/115* (2013.01); *H01L 23/49827* (2013.01); *H01L 23/49866* (2013.01); *H05K 1/03* (2013.01); *H05K 1/09* (2013.01); *H05K 3/42* (2013.01); *H01L 23/14* (2013.01); *H01L 2924/0002* (2013.01); *H05K 2201/0141* (2013.01); *H05K 2201/0175* (2013.01); *H05K 2201/09509* (2013.01); *H05K 2201/10378* (2013.01); *H05K 2203/025* (2013.01); *H05K 2203/1105* (2013.01); *Y10T 29/49165* (2015.01)

(58) Field of Classification Search
CPC ...... H05K 1/112; H05K 1/113; H05K 1/114; H05K 1/115; H05K 1/116
See application file for complete search history.

(56) References Cited

U.S. PATENT DOCUMENTS

| | | | |
|---|---|---|---|
| 2002/0079135 A1* | 6/2002 | Yazaki et al. ................. | 174/264 |
| 2005/0205291 A1* | 9/2005 | Yamashita et al. ........... | 174/254 |
| 2005/0238878 A1* | 10/2005 | Usui et al. ................. | 428/411.1 |
| 2012/0129299 A1* | 5/2012 | Lin et al. ..................... | 438/118 |

* cited by examiner

*Primary Examiner* — Jeremy C Norris
(74) *Attorney, Agent, or Firm* — Forefront IP Lawgroup PLLC

(57) ABSTRACT

A component includes a support structure having first and second spaced-apart and parallel surfaces and a plurality of conductive elements extending in a direction between the first and second surfaces. Each conductive element contains an alloy of a wiring metal selected from the group consisting of copper, aluminum, nickel and chromium, and an additive selected from the group consisting of Gallium, Germanium, Indium, Selenium, Tin, Sulfur, Silver, Phosphorus, and Bismuth. The alloy has a composition that varies with distance in at least one direction across the conductive element. A concentration of the additive is less than or equal to 5% of the total atomic mass of the conductive element, and a resistivity of the conductive element is between 2.5 and 30 micro-ohm-centimeter.

19 Claims, 13 Drawing Sheets

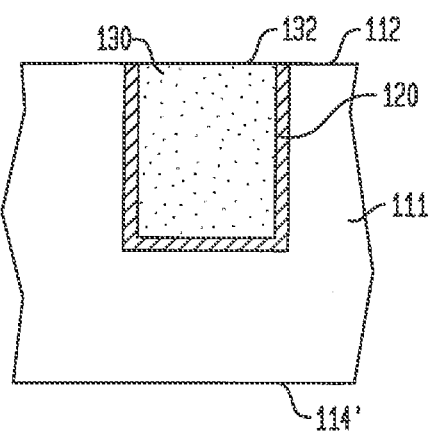
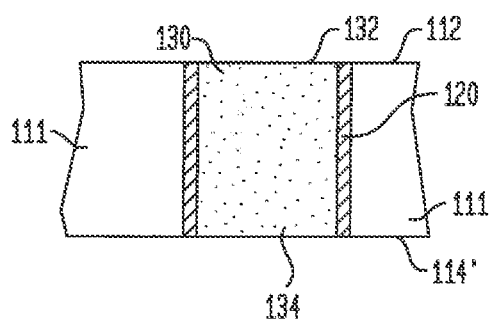
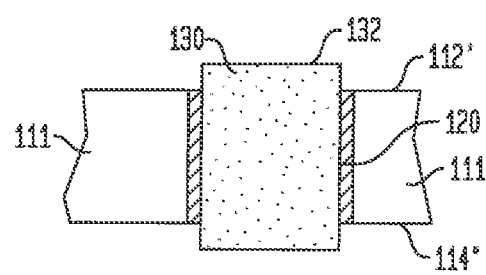

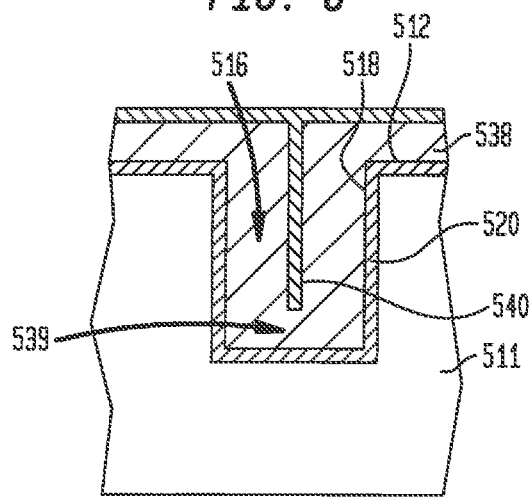
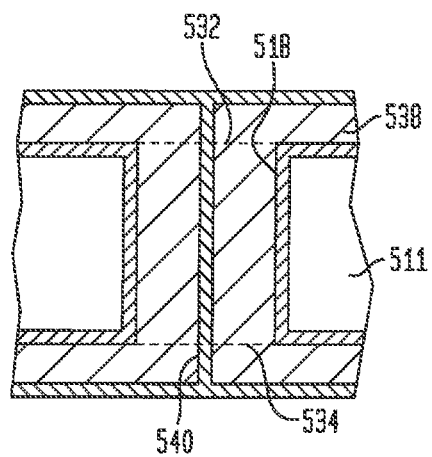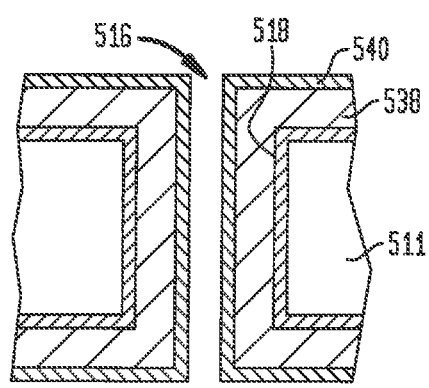

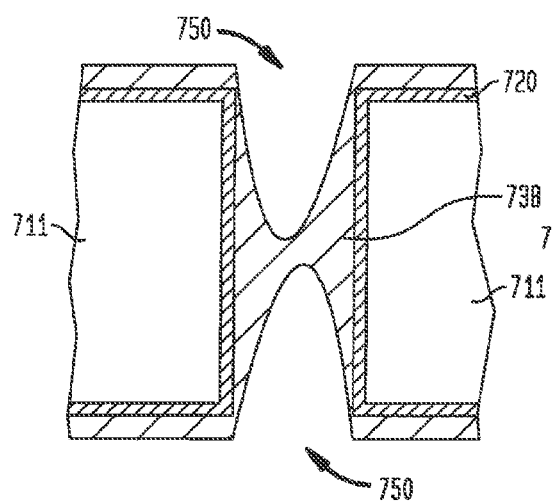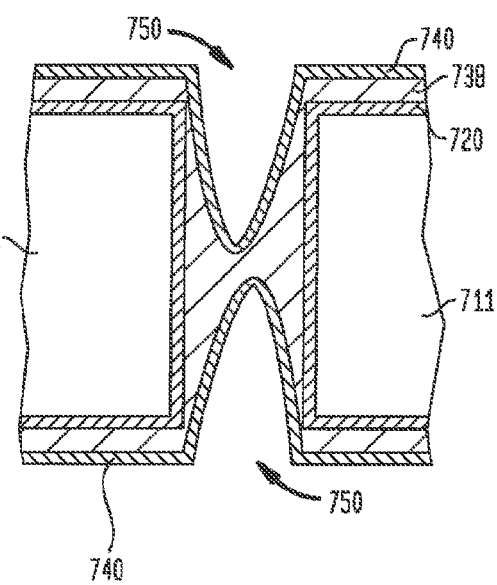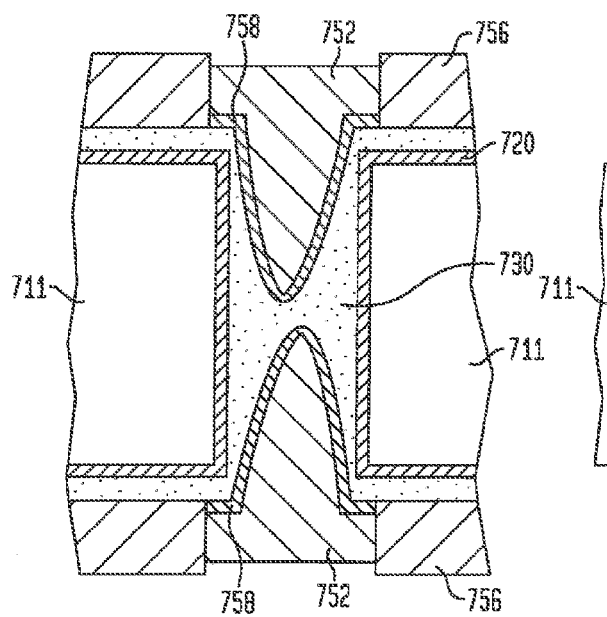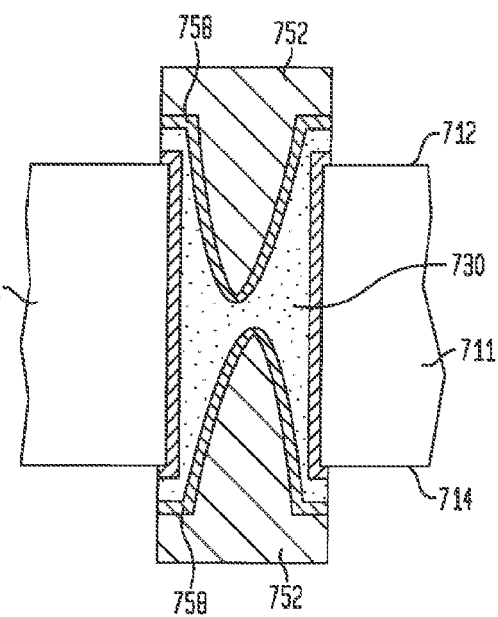

HIGH STRENGTH THROUGH-SUBSTRATE VIAS

CROSS-REFERENCE TO RELATED APPLICATION

This application is a continuation of U.S. patent application Ser. No. 14/337,196, filed Jul. 21, 2014, the disclosure of which is incorporated herein by reference in its entirety.

BACKGROUND OF THE INVENTION

Various components used in microelectronic packaging or in interconnecting microelectronic packages can includes conductive features formed in a support structure in the form of a substrate or the like having vias or other routing or distribution circuitry formed therein. Such features are typically formed from various wiring metal such as copper, gold, nickel, aluminum, etc., which are formed in a support structure such as, for example, a thin dielectric or semiconductor material layer, by a number of different methods.

In some instances, the materials used to form such conductive features were made from a material of the type listed above in a form having impurities therein. Such materials, such as oxygen, nitrogen, chlorine, and carbon, occurred naturally within the material or were added to the material as a by-product of various mineral extraction or processing steps. These and other impurities within the wiring material were known to increase the resistivity of the wiring material, which can slow the performance of microelectronic packages or package assemblies including such wiring material and increase operating temperatures thereof. In addition, these impurities sometimes directly resulted in failure or the creation of defects within wiring circuitry by causing small explosions within the wiring material within which they were embedded. In an effort to reduce the resistivity of components and to otherwise increase their reliability, the previously discussed impurities were reduced in the wiring materials by additional processing, for example, to result in wiring material that was substantially more pure than that which was previously used. The removal of such impurities, however, lead to increased grain size within the wiring material used, which accordingly resulted in a decreased mechanical strength for such materials.

The reduced strength in the materials used to form wiring circuitry can lead to failure within the components within which they are formed. Such failure can include fracture within components due to heat cycling of support structures or other related components. Additional failure can be in the form of delamination from within support structures due to plastic deformation of the wiring components caused by elastic deformation of support structures or thermal expansion thereof. Accordingly, a wiring metal composition and associated method are needed that produce high strength wiring components while maintaining an acceptable level of resistivity without susceptibility to failure modes similar to those of low-purity wiring metals.

BRIEF SUMMARY OF THE INVENTION

An embodiment of the present disclosure relates to a component including a support structure having first and second spaced-apart and parallel surfaces and a plurality of conductive elements extending in a direction between the first and second surfaces. Each conductive element contains an alloy of a wiring metal selected from the group consisting of copper, aluminum, nickel and chromium, and an additive selected from the group consisting of Gallium, Germanium, Indium, Selenium, Tin, Sulfur, Silver, Phosphorus, and Bismuth. The alloy has a composition that varies with distance in at least one direction across the conductive element. A concentration of the additive is less than or equal to 5% of the total atomic mass of the conductive element, and a resistivity of the conductive element is between 2.5 and 30 micro-ohm-centimeter.

At least some of the conductive elements can be filled vias extending between the first and second surfaces and each defining a respective first end surface exposed at the first surface and a second end surface exposed at the second surface. Additionally or alternatively, at least some of the conductive elements can be distribution elements that extend in a thickness between the first and second surfaces and extend in a length in a direction along at least one of the first and second surfaces.

The resistivity of the conductive elements can be less than 10 micro-ohm-centimeter, or in an example less than 5 micro-ohm-centimeter. In another example the resistivity of the alloy within the conductive elements can be less than 10 micro-ohm-centimeter. The resistivity of the conductive elements can further be between 2 and 3.5 micro-ohm-centimeter.

The conductive elements can include a continuous layer of the additive adjacent a portion of the conductive elements including both the wiring metal and the additive. The support structure can include edge surfaces extending between the first and second surfaces and surrounding the conductive elements. The continuous additive layer can be adjacent the edge surface. The edge surfaces can further be defined by a barrier layer formed on the support structure such that the continuous layer is adjacent the barrier layer. In an example, the support structure can be of one of a conducting material or a semiconductor material, and the barrier layer can include an insulating material. The continuous layer can be substantially aligned with one of the first and second surfaces.

The at least one direction along which the alloy composition varies can be substantially parallel to the first and second surfaces of the support structure. In an example where the support structure can include edge surfaces extending between the first and second surfaces and at least partially surrounding the conductive elements, the alloy composition can vary from a first concentration to a second, lower concentration along the direction. In another example, the at least one direction along which the alloy composition varies can be substantially perpendicular to the first and second surfaces of the support structure. The alloy composition can further vary from a first concentration toward the first surface to a second, lower concentration toward the second surface. In an example where the conductive elements include a continuous layer of the additive adjacent a portion of the conductive elements including both the wiring metal and the additive, the direction along which the alloy composition varies can be in a direction away from the continuous layer. The conductive elements can further include portions thereof with a substantially homogeneous alloy composition.

In an example the support structure can consist essentially of a semiconductor material. Additionally or alternatively, the support structure can consist essentially of at least one of, glass, ceramic, liquid crystal polymer material, copper, sapphire, or aluminum.

The alloy can have a first mechanical strength and the wiring metal can have a second mechanical strength such that the first mechanical strength is at least 20% greater than the second mechanical strength. Further, the alloy can have a resistivity that varies with a concentration of additive therein and a mechanical strength that varies with the concentration of additive therein. In such an example, the concentration of additive material in the alloy material can be configured to maximize the mechanical strength while the resistivity is between 2.5 to 10 micro-ohm-centimeter.

The additive can be a layer of additive material that is diffused into at least one adjacent layer of the wiring metal. The additive material layer can be adjacent to the edge surface of the conductive element, and the layer of the wiring metal can overlie the additive material layer. In another example, the additive material layer can overlie the layer of the wiring metal. In such an example, a second layer of the wiring metal can further overlie the additive material layer, the additive being diffused into both the first and second layers of the wiring metal.

The conductive elements can be filled vias, and at least one of the vias can include a concave face exposed at at least one of the first and second surfaces of the support structure. The concave face can define a cavity within a portion of the via. In such an example, the component can further include a bonding metal mass disposed at least partially within the cavity. A barrier layer can be disposed between the concave face and the bonding metal mass.

One or more active devices can be electronically interconnected with at least some of the conductive elements.

Another embodiment of the present disclosure relates to a component, including a support structure having first and second spaced-apart and parallel surfaces and a plurality of metallic vias extending in a direction between the first and second surfaces. Each via contains an alloy of a wiring metal selected from the group consisting of copper, aluminum, nickel and chromium, and an additive selected from the group consisting of Gallium, Germanium, Indium, Selenium, Tin, Sulfur, Silver, Phosphorus, and Bismuth. At least one via includes a concave end surface exposed at at least one of the first and second surfaces of the support structure and defining a cavity within the via. A bonding metal mass is disposed at least partially within the cavity. A concentration of the additive is less than or equal to 5% of the total atomic mass of the metallic via, and a resistivity of the metallic via is less than 10 micro-ohm-centimeter. A barrier layer can be disposed between the bonding metal mass and the concave end surface of the via.

Yet another embodiment of the present disclosure relates to a method for making a component. The method includes depositing a layer of wiring metal within openings in a support structure having first and second spaced-apart and parallel surfaces. The openings extend in a direction between the first and second surfaces. The metal of the wiring metal layer is selected from the group of copper, aluminum, nickel and chromium. The method also includes depositing a layer of an additive selected from the group consisting of Gallium, Germanium, Indium, Selenium, Tin, Sulfur, Silver, Phosphorus, and Bismuth within the openings of the support structure. At least the wiring metal and additive layers are heated to diffuse the additive into the wiring metal to form conductive elements in the openings of the support structure. Each conductive element contains an alloy of the wiring metal with the additive. The alloy has a composition that varies with distance in at least one direction across the conductive element. A concentration of the additive is less than or equal to 5% of the total atomic mass of the conductive element, and a resistivity of the conductive element is between 2.5 and 30 micro-ohm-centimeter. In an example the resistivity of the each conductive structure is less than 10 micro-ohm-centimeter. In an example, the step of heating can cause less than 10% of the additive to be incorporated into the alloy.

The conductive elements can be in the form of filled vias extending at least partially through the support structure, the openings in the support structure being in a corresponding shape to the filled vias. In another example, the conductive elements can be in the form of distribution elements extending in a thickness thereof between the first and second surfaces and extending in at least one lateral direction along either the first or second surfaces of the support structure, the openings in the support structure being in a corresponding shape to the distribution elements.

After heating portions of the conductive elements can extend beyond a surface of the support structure. In such an example, the method can further include polishing the conductive elements to remove the portions of the conductive elements that extend beyond the surface and re-heating at least the conductive elements to form a substantially homogeneous portion of the alloy therein.

At least one opening can have a first diameter, and the additive layer can be deposited at a first thickness therein, the first thickness being less than about 10% of the first diameter. The first thickness can be between about 0.2% and 7% of the first diameter.

The openings can define edge surfaces of the support structure, and the additive layer can be deposited adjacent the edge surfaces. The support structure can include a barrier layer within the openings that defines the respective edge surfaces thereof. In another example, the openings can define edge surfaces of the support structure therein, and the layer of wiring metal can be deposited within the openings adjacent the edge surface with the layer of the additive being deposited over the first layer. Such an exemplary method can further include depositing an additional layer of wiring metal within the openings that overlies the additive layer. The layer of wiring metal can be a super fill layer or a conformal metal layer.

In another example, the layer of additive material can be deposited along the edge surfaces of the openings, and the layer of wiring metal can be subsequently deposited over the additive material layer.

The support structure can include a first surface, the openings being open to the first surface and extending partially through the support structure. In such an example, the method can include removing a portion of the support structure to expose ends of the conductive elements on the support structure opposite the first surface thereof such that the conductive elements are filled vias exposed at the first and second surfaces.

BRIEF DESCRIPTION OF THE DRAWINGS

Various embodiments of the present invention will be now described with reference to the appended drawings. It is appreciated that these drawings depict only some embodiments of the invention and are therefore not to be considered limiting of its scope.

FIGS. 4A-4G show portions of a substrate during various stages of a method for fabrication thereof according to an embodiment of the present disclosure;

FIG. 8 shows a portion of a substrate during various stages of another method for fabrication thereof according to an embodiment of the present disclosure;

FIGS. 9A-9B shows a portion of a substrate during various stages of another method for fabrication thereof according to an embodiment of the present disclosure;

FIGS. 11A-11D show portions of a substrate during various stages of another method for fabrication thereof according to an embodiment of the present disclosure;

DETAILED DESCRIPTION

Figure 1:
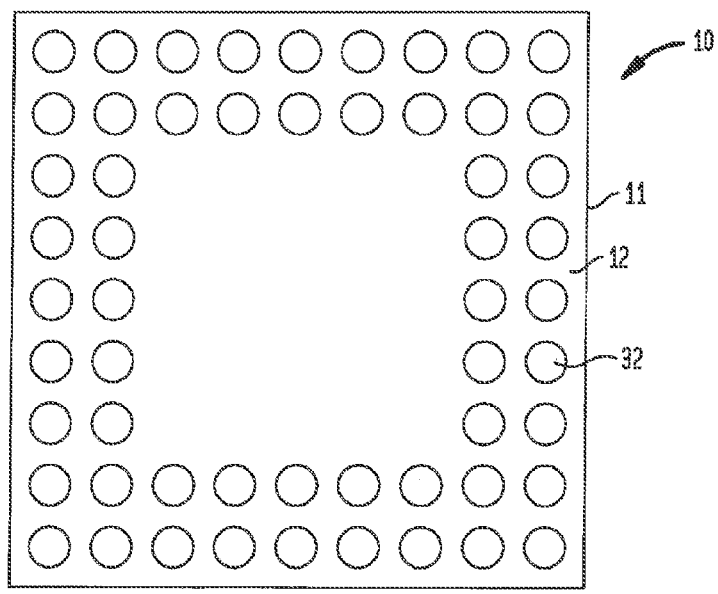
FIG. 1 is a top-plan view of an exemplary substrate according to the present disclosure.
Figure 2:
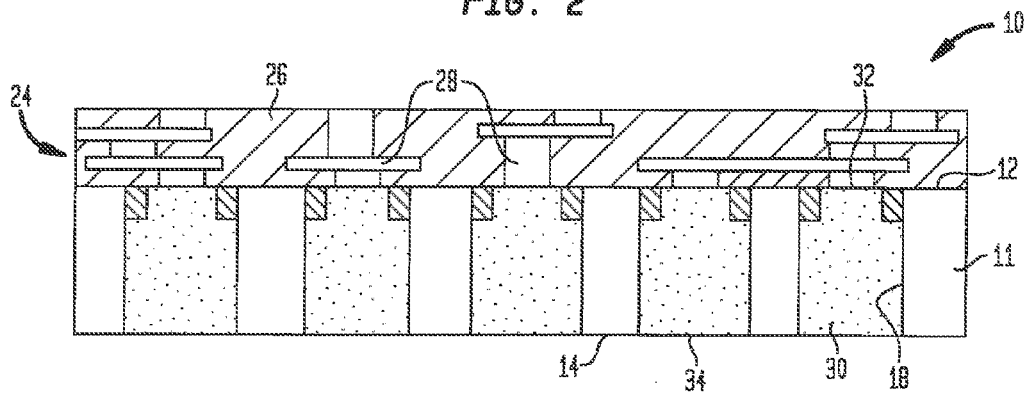
FIG. 2 is a side view of an exemplary substrate according to the present disclosure.

Turning now to the drawings, FIGS. 1 and 2 show a component 10 that can be a substrate, an interposer, or other such connection component used in connection with microelectronic assemblies. In an embodiment, component 10 is an interposer that can connect between a microelectronic element 60 and a circuit panel 70 that can be a printed circuit board ("PCB") or the like. As will be discussed, component 10 is configured to provide an electrical connection between contacts 62 exposed at a face of the microelectronic element 60 and contacts 72 exposed at a face of the circuit panel 70 and can further include a redistribution layer 24 on one side 12 thereof or multiple redistribution layers (not shown) on both sides 12 and 14 thereof. Such a redistribution layer 24 can include internal wiring 28 therein to facilitate electronic connection therethrough and can be configured to connect other components, such as a microelectronic element 60 and a circuit panel 70) having contacts with different spatial distributions. Component 10 can include a number of metallic vias 30 formed through a support layer or structure 11. As shown in FIG. 1, the vias 30 can be distributed in an array including various rows or columns of vias 30 that can be defined by a pitch or a uniform distance between vias 30. Other arrangements are possible as needed to make the desired connection between additional components. In addition, component 10 can include a number of traces or other distribution features formed therein that can, for example, connect vias 30 together or can form other routing circuitry between contact pads that can be exposed at one of the surfaces of the support structure 11.

In an embodiment, support structure 11 can include a dielectric or semiconductor material or a combination thereof, and in a particular example, may be of glass, sapphire, ceramic, or liquid crystal polymer material. Support structure 11 can include two substantially parallel and spaced-apart faces that can be a front face 12 and a back face 14. The faces 12 and 14 can be spaced apart at a distance that defines a thickness for substrate 10. The thickness of substrate 10 can be between 5 and 500 microns and in some embodiments can be up to 1000 microns. A plurality of openings 16 are formed in support structure 11 in the desired locations for vias 30 and define respective edge surfaces 18 that extend between the front 12 and back 14 faces of the substrate 10. In some embodiments, a boundary layer 20 can be positioned within opening 18 such that the boundary layer 20 defines the edge surface 18 of the support structure 11. Such a boundary layer 20 can be a barrier layer of a dielectric material, which can insulate the via 30 from a support structure 11 made from a semiconductor material or from a conductive material such as copper or aluminum, should one be used. Additionally or alternatively, the boundary layer 20 can be a seed layer of a catalyst material such as palladium, for example, that is used to facilitate growth of layers of metal that can be built up to make vias 20 by a electroplating or electro less plating process, as will be discussed below.

Vias 30 are made from a metallic alloy that includes a metal material and an additive. Further in embodiments that additionally or alternatively include distribution circuitry, such as traces, within support structure 11, such distribution circuitry can also include such an alloy. As previously discussed, via structures have been developed that utilize a metal material having reduced levels of impurities such as oxygen, nitrogen, carbon, chlorine, and the like. The inventors have found that removal of such impurities has led to improvements in resistivity (by providing relatively lower resistivity) and can reduce grain boundary separation during annealing which can be caused by small explosions of some impurities at high temperatures. However, such low-impurity metal vias can have a low mechanical strength due to the increased grain size (as dictated by the Hall-fetch relation) that results from removing such impurities. This low mechanical strength can lead to undesirable plastic deformation during heat cycling caused by use of the components in which they are used. This can result in separation from a support structures in which the vias are formed or other failure such as fracture at any sharp corners. Additionally, fracture or delamination can occur due to elongation of the vias due to mechanical "pumping" or repeated reduction of the diameter of the openings in which the vias are formed. Such low-impurity vias can also exhibit undesirably high degrees of electro migration. Accordingly vias 30 of the component 10 disclosed herein can include controlled amounts of an additive that can increase the mechanical strength of the via 30 and decreasing electro migration without the grain boundary separation or great increase in resistivity caused by the impurities discussed above.

In an example vias 30 and/or distribution circuitry can be of an alloy material that includes a majority of a wiring metal acceptable for forming electrical connections in microelectronic assemblies. Such wiring metals can include copper, aluminum, nickel, or chromium. Combinations of such materials can also be used. The alloy material of vias 30 can also include an additive dispersed or diffused in the wiring metal. Such additives can include Gallium, Germanium, Indium, Selenium, Tin, Sulfur, Silver, Phosphorus, or Bismuth. The relative quantities of both the wiring metal and the additive can vary according to a number of factors. In an embodiment, the additive can have a concentration of between 0.1% and 10% by molecular weight of the overall alloy material. In another embodiment, the molecular weight concentration of the additive can be at least 0.3% of the alloy material. In some embodiments, the molecular weight concentration of the additive can be less than 5% of the alloy material.

A number of factors can influence the desired concentration of additive within the alloy material, and the overall affect of the additive concentration can vary depending on the particular additive used and the wiring metal into which it is diffused. One such factor is a balancing of the benefit of increased mechanical strength of the via attributable to the additive and the increased resistivity of the via that is also caused by incorporation of the additive. This balancing can be done by adding enough additive to reach the desired mechanical strength for the alloy material while keeping the resistivity of the alloy material below a desired maximum resistivity. In an embodiment, the alloy material includes a quantity of additive that increases the mechanical strength of the via 30 to within a desired range while keeping the resistivity of the alloy material below 30 micro-ohm-cm. Various embodiments of the alloy material used for vias 30, including various combinations of the wiring metals and additives listed above, can have a resistivity of between 2.5 and 10 micro-ohm-centimeter. In an embodiment, an alloy material used for vias 30 can have a resistivity between 3 and 7 micro-ohm-cm.

The desired yield strength of the alloy material for vias 30 and other conductive features can vary depending on the application, as can the desired increase in yield strength attributable to addition of the additive. In an example, the yield strength can be increased to an amount such that a via 30 is able to elastically deform without reaching its elastic limit (at which point it will plastically deform) through a range of stress caused by normal expansion and contraction of the support structure 11 during heat cycling caused by the intended use for substrate 10. Accordingly, the desired yield strength can vary by the coefficient of thermal expansion ("CTE") of the support structure 11 and by the conditions under which substrate 10 is intended to be used (i.e. the amount of heat cycling that via 30 needs to withstand. In an example, the opening 16 can contract during operation of a microelectronic assembly including substrate 10 due to heat cycling caused by other components that causes expansion of support structure 11. Such contraction of opening 16 can apply a strain to via 30, and it can be desired for via 30 to have a yield strength high enough so that it does not plastically deform due to such contraction because it could fracture of become delaminated from edge surface 18 when opening 16 returns to its normal size. Accordingly, the additive can be included to an amount that gives a high enough yield strength such that via 30 only deforms elastically, allowing it to return to its rest size along with opening 16. Vias 30 can also undergo other types of strain caused by other movements of components in an assembly that increased yield strength can withstand.

By way of example, bulk copper can have a yield strength of about 50 to 70 Map and a resistivity of about 1.8 to 2 micro-ohm-centimeters. An additive such as those listed above can be added to copper to an amount of less than for example 5% by total molecular weight of the resulting alloy material. The resulting alloy can have a yield strength of at least about 100 Map while maintaining a resistivity below 7 micro-ohm-centimeter.

Depending on how vias 30 are formed, there may be variations in the material composition of the alloy material within the vias 30 themselves. Such variations can include regions within the via structures of a substantially homogenous alloy composition (with respect to the concentration and mixture of wiring metal and additive, for example) and/or various areas with a composition gradient (areas of transition where the composition changes over a distance). As shown in FIG. 2, a via 30 can include a homogenous area 44 that can, for example, be disposed toward the center thereof. Homogenous area 44 can be in other areas, such as near edge surface 18, or toward either end surface 32 or 34 of via 30. A gradient area 46 or multiple gradient areas can be interspersed with the homogenous area(s) 44. In the example of FIG. 2, an area of high additive concentration 48 can be, for example, toward or adjacent edge surface 18 of opening 16 and gradient area 46 can have a concentration that decreases in a direction 42 toward the center of via 30 to homogenous portion 44, where the composition is substantially uniform. In other arrangements, a high additive area can be disposed near one or more of the end surfaces 32,34 of via and can be surrounded by a gradient area that varies toward the opposite surface and/or toward the edge surface 18. In such an example, a homogenous area may or may not be present.

Figure 3:
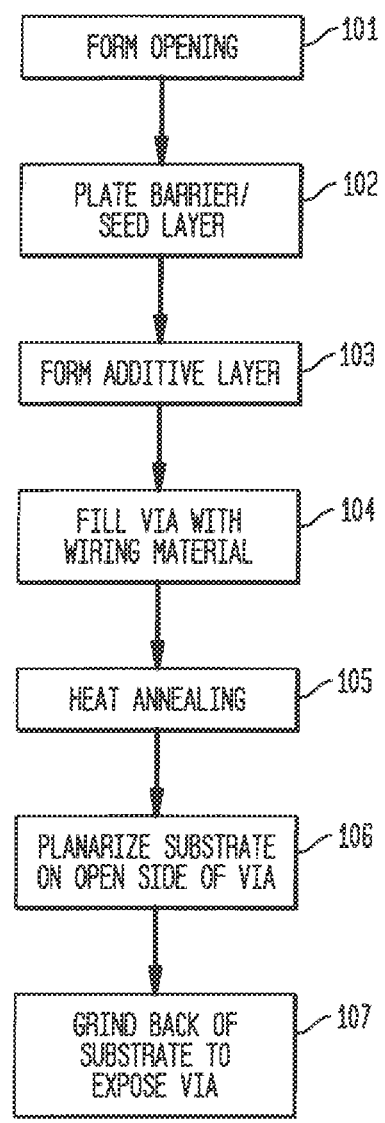
FIG. 3 is a flowchart showing steps in an exemplary method for making a substrate according to an embodiment of the present disclosure.
Figure 4A:
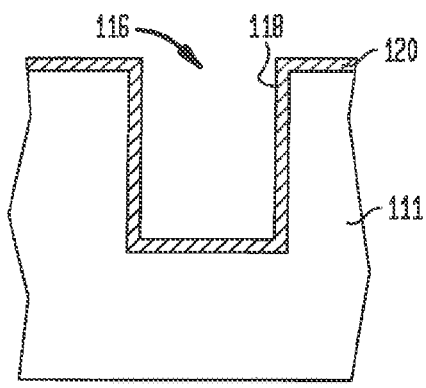

FIG. 3 shows a flowchart including various steps that can be carried out in an exemplary method to form vias having an alloy material, as discussed above with respect to via 30. In step 101, openings, such as openings 16, are formed in the support structure 11 according to a desired configuration that can depend on the intended use for substrate 10. As shown in FIG. 4A, openings 116 can be blind openings that are only open to a single surface 112 of support structure 111. This can allow a thicker support structure that can be easier to handle and less likely to be damaged during fabrication. In other embodiments (discussed later) the openings can be through holes. In step 102, a boundary layer 120 (FIG. 4A), in the form of a seed layer or the like, can be formed along the inside of opening 116 to form edge surface 118. Boundary layer 120 can be formed by plating or by sputtering, depending on the material used. In step 103, an additive layer 140 is formed along edge surface 118. This can be done using any of the materials listed above and can be completed by an electroplating or an electro less plating process such as by indium, gallium or selenium plating in a chloride bath. In some instances, more than one plating bath can be used to give additive layer 140 an alkaline chemistry or to form a flash layer of a protective material such as copper thereon at a thickness of for example 200 angstroms. Doing so can protect additive layer 140 from acids used in plating of additional layers thereon. In other embodiments, additive layer 140 can be formed by sputtering, or evaporation deposition.

Figure 4B:
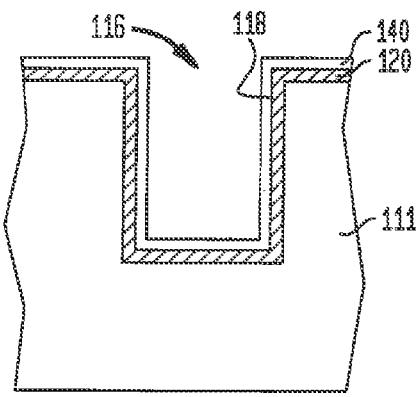

Similar processes can be carried out to form distribution features such as traces or the like. In particular, to form traces, which extend in one or more lateral directions along one of the surfaces, trenches can be formed in support structure 11. Such trenches can appear similar in a cross-section to the opening 16 shown in FIGS. 4A and 4B and can extend in one or more lateral directions (such as into and out of the page in FIG. 4A. The trenches can further extend in other lateral directions, as necessary to form the desired routing pattern for the traces to be formed from the trenches. The steps of boundary layer formation and additive layer formation discussed above in connection with FIG. 4B can be similar in embodiments including trenches, with the laterally-extending trenches being similarly coated along the edge surfaces defined thereby.

Figure 4C:
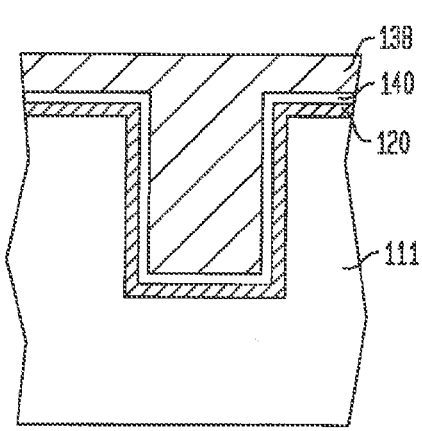
Figure 4D:
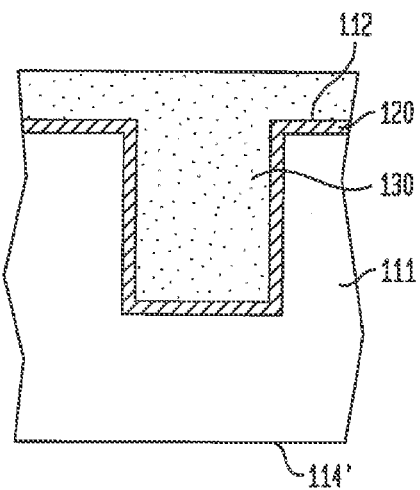

In step 104, wiring metal layer 138 (FIG. 4C) is formed to fill the remaining portion of opening 116. This can be done by plating using any of the wiring metals listed above. Subsequently, a heat-annealing process can be performed to diffuse all or some of the additive material in additive layer 140 into the wiring metal material of wiring metal layer 138 (FIG. 4D). Such a process can be carried out in ambient atmosphere or in a vacuum and can be conducted at temperatures ranging from 100° C. to 400° C. and for a time period of between about 30 seconds to about 2 hours. The time and temperature for such annealing can depend on the materials used for the additive and the wiring metal and the desired size and structure for vias 130. In general, a higher temperature can be applied for a relatively shorter period of time (e.g. rapid thermal annealing) and vice-versa. In other processes, a high temperature can be applied for a short amount of time, followed by continued annealing at a low temperature over a period of time. The diffusion of the additive material into the wiring metal material during the heat annealing can result in improved grain boundary growth.

After heat annealing, the resulting structure can be planarized in step 106, such as by grinding or the like, to form end surface 132 that can be substantially flush with front surface 112 (FIG. 4E). Additionally, the back side 114' of the support structure 111 can be ground down in step 108 to expose end surface 134 and to form back surface 114 substantially flush with end surface 134 (FIG. 4F). The steps of planarizing 106 and grinding 108 can be carried out in any relative order. Additional back-end steps can be applied to substrate 110, as desired by the application intended therefore. In an embodiment, the in-process unit 110' can be heat annealed a first time, during which any impurities within the alloy composition may diffuse within the material toward the outer portions of the material with respect to the opening 116. The planarization step can then remove the portions of the alloy material that include such impurities. After planarization, a second heat annealing process can be applied to further diffuse additive material into wiring metal material. Additional processing, such as etching or the like, can be used to further remove portions of support structure 11 such that the end surfaces 32,34 of via 30 extend above front face 12' and back face 14". It is noted that in embodiments where the method is used to form distribution circuitry in addition or alternatively to vias 30, any back end processing can be carried out such that the traces formed by such a method are not exposed at the second surface 14 of the support structure 11 after grinding or the like.

The molecular-weight composition of the alloy material formed in via 130 (or other forms of vias discussed herein) can be controlled by the relative thicknesses of the additive layer 140 and the wiring material layer 138. In an example, a 3 micron diameter opening 116 (measured inside any boundary layer 120 applied therein) can be filled with a 5 nanometer layer of additive material and the rest of the volume of opening 116 can be filled with wiring metal to give a molecular weight concentration of about 0.2% additive over the volume of via 130 (i.e. irrespective any variations through or across via 130). Similarly a 3 micron opening 118 can be filled with an additive layer having a thickness of about 200 nanometers and the remaining volume can be filled with a wiring metal to give a molecular weight concentration of about 6.7% additive over the volume of via 130. As discussed above, such a via can include various gradient and homogenous portions and high-additive areas throughout its structure. In other embodiments where the additive layer 140 is not formed adjacent edge surface 118, the thickness of the additive layer can be increased to result in the desired concentrations.

Figure 5A:
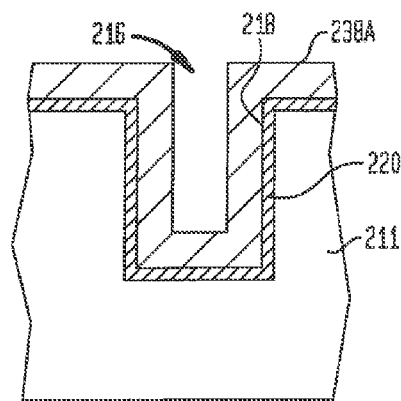
FIGS. 5A-5*d* show portions of a substrate during various stages of another method for fabrication thereof according to an embodiment of the present disclosure.
Figure 5B:
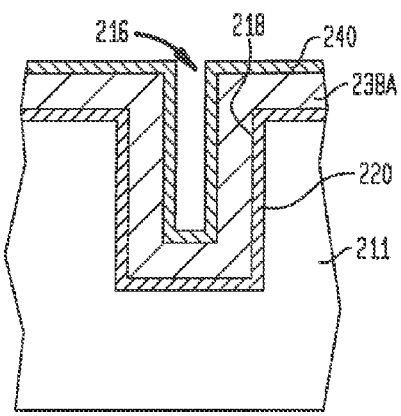
Figure 5C:
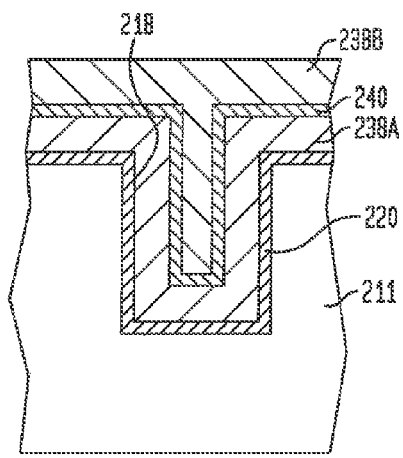
Figure 5D:
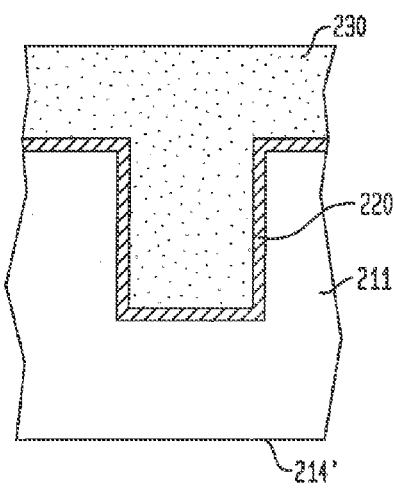
Figure 6A:
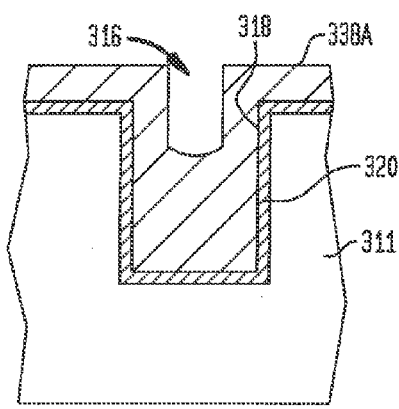
FIGS. 6A-6D show portions of a substrate during various stages of another method for fabrication thereof according to an embodiment of the present disclosure.
Figure 6B:
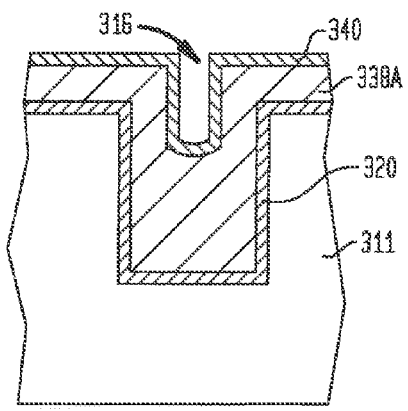
Figure 6C:
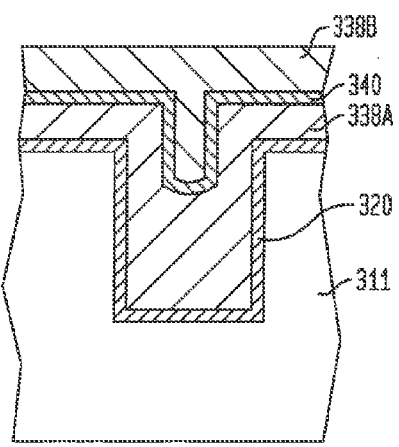
Figure 6D:
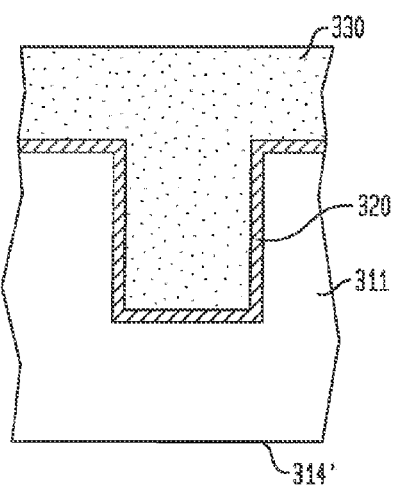

Additional wiring metal layers or additional additive layers can be incorporated into an in-process (i.e. pre-annealing) structure to result in different additive concentration configurations for vias. In an example shown in FIGS. 5A-5D, a boundary layer 220 in the form of a seed layer, for example, can be formed within opening 216 and a first wiring metal layer 238A can be plated over boundary layer 220 (FIG. 5A). Subsequently, an additive layer 240 can be plated over wiring metal layer 238A and a second wiring metal layer 238B can be plated over that to fill the remainder of opening 216. The structure can then be heat annealed, as discussed above with respect to FIG. 4D to diffuse the additive and wiring metal into each other to form the alloy structure for via 230. A structure of this type may take less time to anneal for a given opening size than the embodiment of FIG. 4D. Such a process, depending on the particular annealing carried out, can result in areas of high additive concentration in the area where additive layer 240 was applied, with gradient areas extending inward and outward therefrom. Homogenous areas can also be present in such a structure. The in process unit 210' of FIG. 5D can then be finished in a similar manner as the structure discussed in FIGS. 4E and 4F.

Figure 7A:
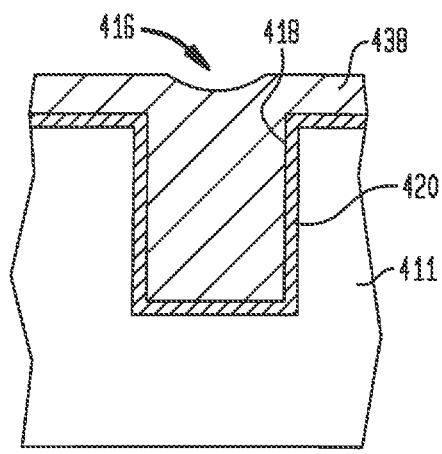
FIGS. 7A and 7B show portions of a substrate during various stages of another method for fabrication thereof according to an embodiment of the present disclosure.
Figure 7B:
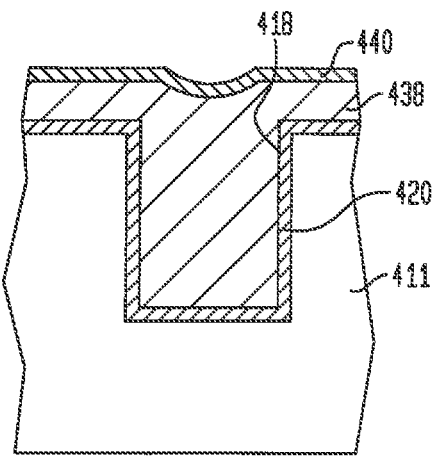

FIGS. 6A-6D show steps in a method similar to that shown in FIGS. 5A-5D above, except that a super fill process can be used to form wiring metal layer 338A within opening 316. Additive layer 340 can then be applied over the super fill wiring metal layer 338A before adding a second wiring metal layer 338B before annealing and finishing, as discussed above. FIGS. 7A and 7B show steps of a method that is a variation of that shown in FIGS. 6A-6D. In such a variation, the super fill wiring metal layer 438 can be formed such that it substantially fills opening 416 and results in a concavity 450 that overlies opening 416 but is spaced above surface 412. The concavity 450 can be formed in a portion of wiring metal layer 438 that extends along surface 412 in areas between openings 416. An additive layer 440 can then be formed over wiring metal layer 438. The in-process unit 410' of FIG. 7B can then be heat annealed to diffuse the additive into the wiring metal to form the alloy composition of via 430. Such a structure can have an area of a high additive composition that is outside of opening 416 such that it is polished off during the step of planarization (discussed above in step 106). This can result in a lower concentration gradient or larger homogenous areas within the final via 430 composition.

FIG. 8 shows an opening 516 in a support structure 511 that has a conformal wiring metal layer 538 formed over boundary layer 520. The conformal wiring metal layer 538 can be formed in a substantially uniform manner over edge surface 518 such that a narrow opening 539 is left toward the center of opening 516. This opening 539 can then be filled with the additive metal layer 540 by plating or the like. The opening 539 left within wiring metal layer 538 can be made of an appropriate size (diameter, for example) to contain an amount of additive to achieve the desired molecular weight percentage concentration of additive within the completed alloy structure of via 530. After formation of additive layer 540, the in-process unit 510' can be heat annealed to diffuse the additive material into the wiring metal to form the alloy composition of vias 530. The resulting structure can then be finished, as discussed above, including planarization to remove excess material over surface 512 or grinding to expose end 534 at surface 514. FIG. 9A shows a conformal wiring metal layer 538 formed within an opening 516 that extends through support structure 511 such that it is open to both front surface 512 and back surface 514. In such a method, excess material may be present over both surfaces 512 and 514 after alloy formation. In such an instance, both sizes of in-process unit 510' can be planarized, such as by grinding, lapping or the like to form end surfaces 532 and 534 of via 530. A further variation is shown in FIG. 9B, wherein the center of via 530 remains open after deposition of additive layer 540 and will further remain open after heat annealing to form the alloy composition. Such a structure can be useful when assembling component 510 with an external structure using pins to connect with vias 530.

Figure 10A:
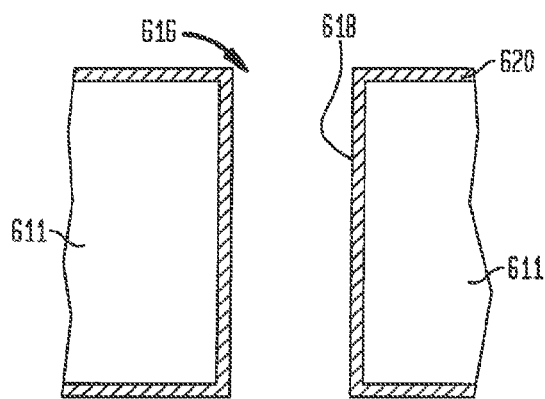
FIGS. 10A-10F show portions of a substrate during various stages of another method for fabrication thereof according to an embodiment of the present disclosure.
Figure 10B:
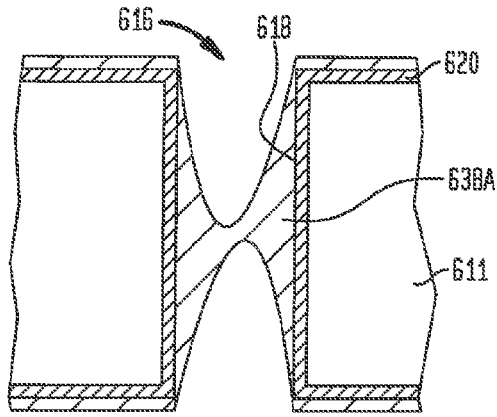
Figure 10C:
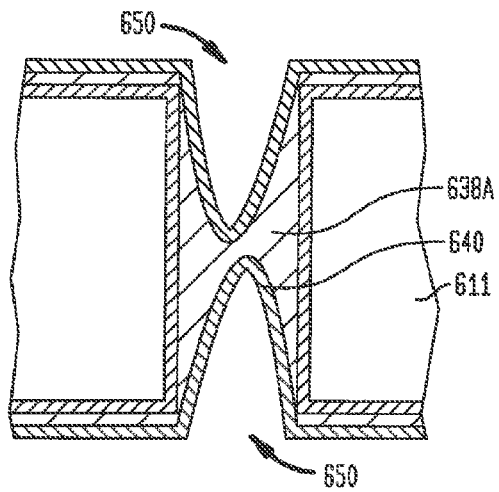

FIGS. 10A-10F show an embodiment of a method for forming alloy vias 630 in openings 616 in a support structure 612, wherein the openings 616 extend through support structure 612 and are open to both front surface 612 and back surface 614 thereof. As in the other method embodiments, openings 616 can first be coated with a boundary layer 620 to form an edge surface 618 (FIG. 10A). Wiring metal layer 638 is then formed over boundary layer by a plating procedure that builds up the wiring metal within opening 616. By plating the wiring metal layer 638A into the through opening 616 a structure similar to that shown in FIG. 10B, wherein the wiring metal layer 638A extends across opening 616 toward the vertical center thereof (approximately equidistant between front surface 612 and back surface 614). Cavities 650 are formed in the wiring metal layer 638A that extend inward from respective surfaces 612 and 614 of support structure 611 into the opening 516 toward the center thereof. The cavities 650 are generally concave in shape and can be generally parabolic or the like. Additive layer 640 is then plated over wiring metal layer 638A within cavities 650, as shown in FIG. 10C. The thickness of additive layer 640 can be selected, as discussed above, to achieve the desired molecular weight concentration of the additive material within the alloy composition of via 630.

Figure 10D:
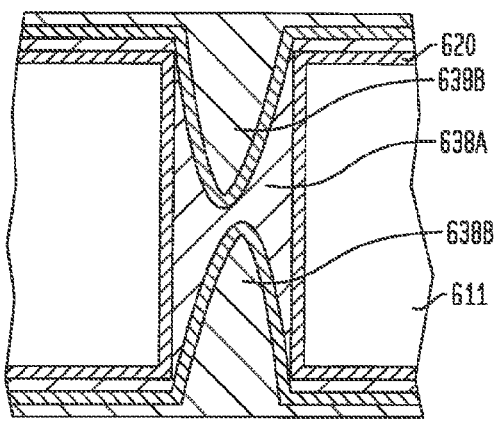
Figure 10E:
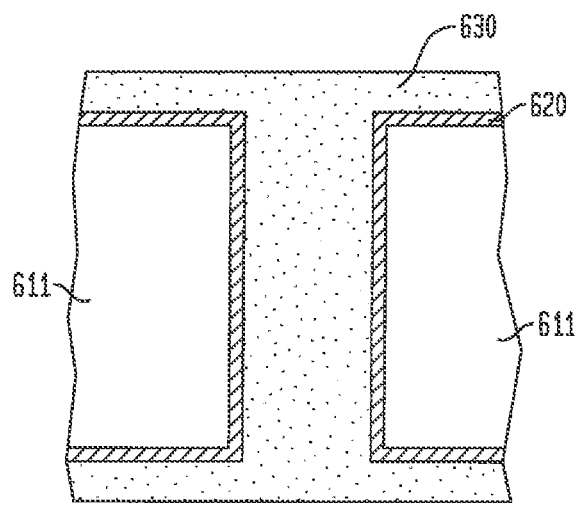
Figure 10F:
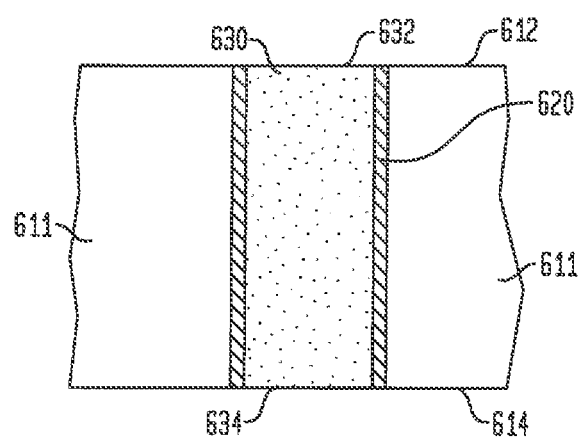
Figure 12A:
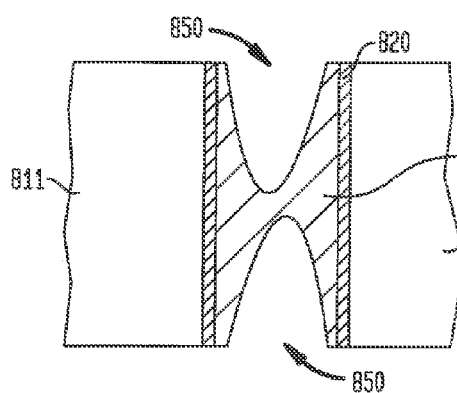
FIGS. 12A-12D show portions of a substrate during various stages of another method for fabrication thereof according to an embodiment of the present disclosure.
Figure 12B:
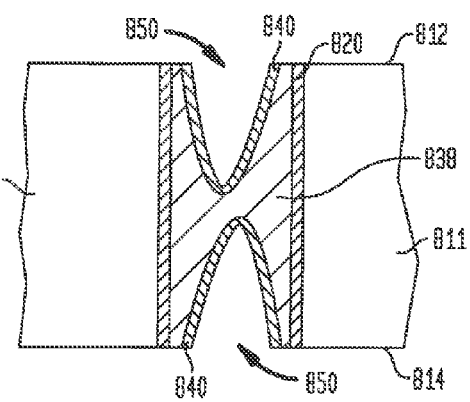
Figure 12C:
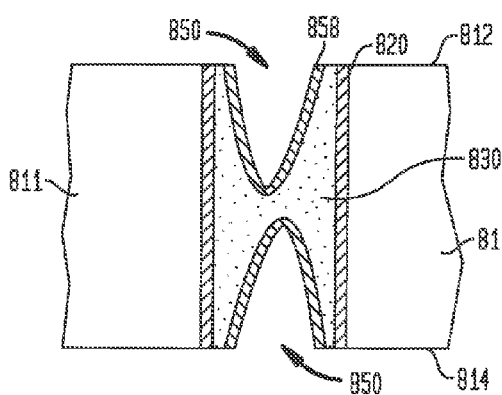
Figure 12D:
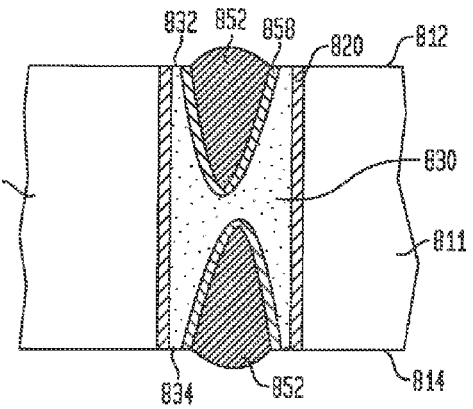
Figure 13A:
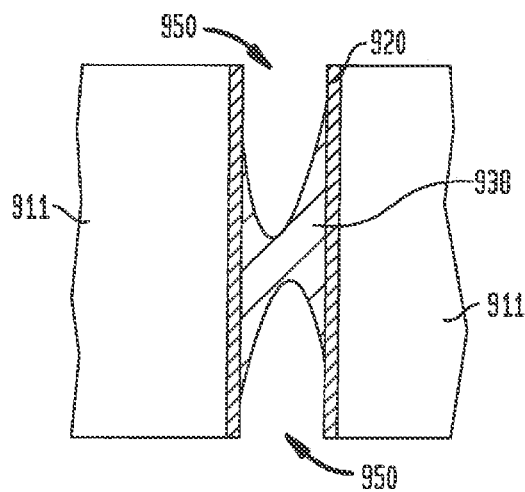
FIGS. 13A-13D show portions of a substrate during various stages of another method for fabrication thereof according to an embodiment of the present disclosure.
Figure 13B:
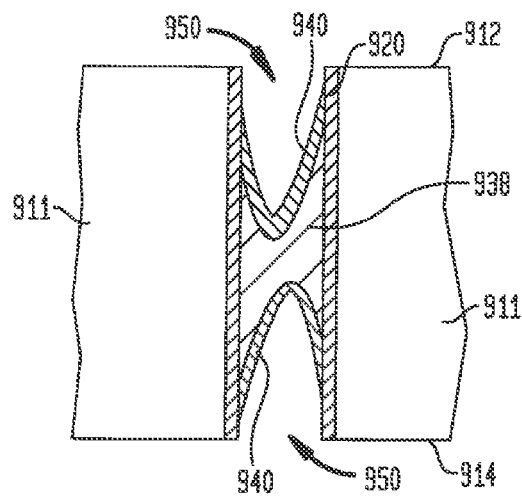
Figure 13C:
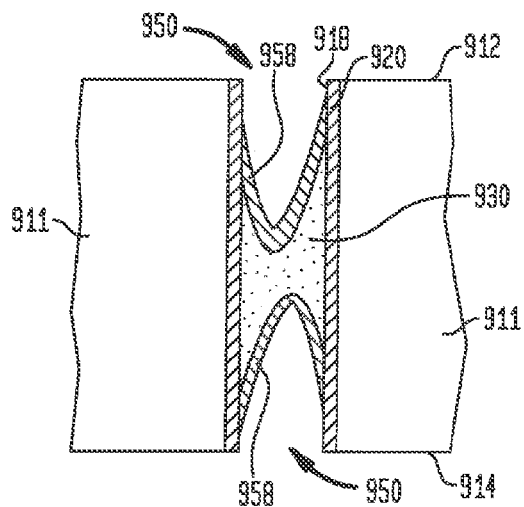
Figure 13D:
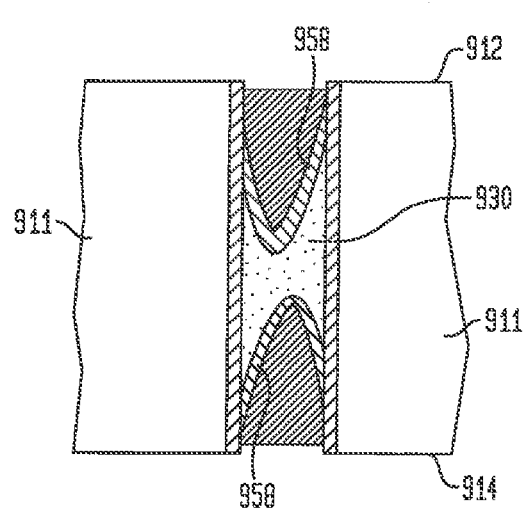

As shown in FIG. 10D, a second wiring metal layer 638B can be formed over each additive layer 540 to fill cavities 650. The resulting in-process unit 610' can be heat annealed, as discussed above, to give the desired alloy composition, as shown in FIG. 10E. Excess material, such as annealed alloy material, extending along surfaces 612 and 614 can then be removed by grinding, lapping, or the like to expose end surfaces 632 and 634 of via 630, as shown in FIG. 8F.

FIGS. 11A-11D show a similar method embodiment to that shown in FIGS. 10A-10F. In the embodiment of FIGS. 11A-11D, however, a bonding metal mass 752 is deposited within cavities 750 instead of a second wiring metal layer, as in FIG. 10D. A barrier layer 758 can be deposited over the exposed portions of vias 730 prior to depositing the bonding metal mass 752 to prevent unwanted diffusion between the alloy material and the bonding material and to promote attachment of the bonding layer 758. Such a barrier layer 758 can be formed by emission plating with nickel, gold, palladium or the like. As shown in FIG. 11C, a solder resist layer 756 can be formed over in-process unit 710', including over any of wiring metal layer 738 and additive layer 740 that extends over surfaces 712 and 714. Bonding material masses 752 can then be formed to extend above surfaces 712 and 714 and out of opening 716. After removal of the solder resist layer 756, the excess portions of the alloy material over surfaces 712 and 714 can be removed by etching, grinding, lapping or the like. A similar method embodiment is shown in FIGS. 12A-12D, wherein bonding material masses 852 are deposited in cavities 850 without the use of a solder resist layer. FIGS. 13A-13D show steps in a further similar method in which vias 930, including wiring metal 938 and additive layer 940 are formed such that at a highest point, they are still beneath front and back surfaces 912,914 of support structure 911. Further, bond metal masses 952 are formed to cover surfaces 932 and 934 of vias 930 while remaining beneath surfaces 912 and 914. In an example, the combination of vias 930 and bond metal masses 954 fill up to about 80% of the height of the openings 916 in support structure 911. Such recessed via structures can be used to bond with, for example, the projecting via structures shown in FIG. 4G such that the projecting vias extend into the unfilled portions of the openings associated with the recessed via structures and into contact with the bonding metal masses 954, which can be heated to achieve bonding with the projecting vias.

In an embodiment, any one of the above-described substrates, including the associated vias made by any of the above method embodiments, can be in the form of a microelectronic element including one or more active devices. In such an embodiment, the vias can be electrically interconnected with the active device or devices through internal circuitry within the substrate, including traces or the like. The vias in such a microelectronic device can be exposed at the front face of the substrate only or at both surfaces. The exposed via end surfaces can be used to connect the microelectronic element with a package substrate or with a circuit panel such as a PCB or with another microelectronic element.

Although the description herein has been made with reference to particular embodiments, it is to be understood that these embodiments are merely illustrative of the principles and applications of the present disclosure. It is therefore to be understood that numerous modifications may be made to the illustrative embodiments and that other arrangements may be devised without departing from the spirit and scope of the present disclosure as defined by the appended claims.

The invention claimed is:

1. A component, comprising:
a support structure having first and second spaced-apart and parallel surfaces and a plurality of conductive elements extending in a direction between the first and second surfaces, each conductive element containing an alloy of a metal material selected from the group consisting of copper, aluminum, nickel and chromium, and an additive selected from the group consisting of Gallium, Germanium, Indium, Selenium, Tin, Sulfur, Silver, Phosphorus, and Bismuth, wherein the conductive elements are filled vias, and wherein at least one of the vias includes a concave face exposed at least one of the first and second surfaces of the support structure and defining a first cavity within a portion of the at least one of the vias that defines a second cavity with a second bonding metal mass disposed at least partially within the first cavity, wherein the first and second cavities are laterally offset from one another.

2. The component of claim 1, wherein at least some of the conductive elements are filled vias extending between the first and second surfaces and each defining a respective first end surface exposed at the first surface and a second end surface exposed at the second surface.

3. The component of claim 1, wherein at least some of the conductive elements are distribution elements that extend in a thickness between the first and second surfaces and extend in a length in a direction along at least one of the first and second surfaces.

4. The component of claim 1, the alloy having a composition that varies with distance in a direction across the conductive element substantially parallel to the first and second surfaces of the support structure.

5. The component of claim 4, wherein the support structure includes edge surfaces extending between the first and second surfaces and at least partially surrounding the conductive elements, and wherein the alloy composition varies from a first concentration to a second, lower concentration along the direction.

6. The component of claim 1, wherein the at least one direction along which the alloy composition varies is substantially perpendicular to the first and second surfaces of the support structure.

7. The component of claim 1, wherein the alloy composition varies from a first concentration toward the first surface to a second, lower concentration toward the second surface.

8. The component of claim 1, wherein the conductive elements include a continuous layer of the additive adjacent a portion of the conductive elements including both the metal material and the additive, and wherein the direction along which the alloy composition varies is a direction away from the continuous layer.

9. The component of claim 1, wherein the support structure consists essentially of at least one of, semiconductor, glass, ceramic, liquid crystal polymer material, copper, sapphire, or aluminum.

10. The component of claim 1, wherein the alloy has a first mechanical strength and the metal material has a second mechanical strength, and wherein the first mechanical strength is at least 20% greater than the second mechanical strength.

11. The component of claim 1, wherein the alloy has a resistivity that varies with a concentration of additive therein and a mechanical strength that varies with the concentration of additive therein, and wherein the concentration of additive material in the alloy material is configured to maximize the mechanical strength while the resistivity is between 2.5 to 10 micro-ohm-centimeters.

12. The component of claim 1, wherein the additive is a layer of additive material diffused into at least one adjacent layer of the metal material.

13. The component of claim 12, wherein the additive material layer is adjacent to the edge surface of the conductive element, and wherein the layer of the metal material overlies the additive material layer.

14. The component of claim 12, wherein the additive material layer overlies the layer of the metal material.

15. The component of claim 14, wherein a second layer of the metal material further overlies the additive material layer, the additive being diffused into both the first and second layers of the wiring metal material.

16. The component of claim 1, further including a bonding metal mass disposed at least partially within the first cavity.

17. The component of claim 16, further including a barrier layer disposed between the concave face and the bonding metal mass.

18. The component of claim 1, further including one or more active devices electronically interconnected with at least some of the conductive elements.

19. A component, comprising:
   a support structure having first and second spaced-apart and parallel surfaces and a plurality of metallic vias extending in a direction between the first and second surfaces, each via containing an alloy of a wiring metal selected from the group consisting of copper, aluminum, nickel and chromium, and an additive selected from the group consisting of Gallium, Germanium, Indium, Selenium, Tin, Sulfur, Silver, Phosphorus, and Bismuth, at least one via including a concave end surface exposed at at least one of the first and second surfaces of the support structure and defining a cavity within the via;
   wherein at least one of the vias includes a concave face exposed at least one of the first and second surfaces of the support structure and defining a first cavity within a portion of the at least one of the vias that defines a second cavity with a second bonding metal mass disposed at least partially within the first cavity, wherein the first and second cavities are laterally offset from one another; and
   a bonding metal mass disposed at least partially within the first cavity
   wherein the alloy has a first mechanical strength and the wiring metal material has a second mechanical strength, the first mechanical strength characteristic being greater than the second mechanical strength.

* * * * *